United States Patent [19]

Haque et al.

[11] Patent Number: 4,590,440
[45] Date of Patent: May 20, 1986

[54] PHASE LOCKED LOOP WITH HIGH AND/OR LOW FREQUENCY LIMIT DETECTORS FOR PREVENTING FALSE LOCK ON HARMONICS

[75] Inventors: Yusuf A. Haque; Ashraf K. Takla, both of San Jose, Calif.

[73] Assignee: American Microsystems, Inc., Santa Clara, Calif.

[21] Appl. No.: 628,608

[22] Filed: Jul. 6, 1984

[51] Int. Cl.[4] .............................................. H03L 7/06
[52] U.S. Cl. ...................................... 331/17; 331/25; 331/DIG. 2
[58] Field of Search ........................ 331/11, 16, 17, 25, 331/DIG. 2

[56] References Cited

U.S. PATENT DOCUMENTS

| | | | |
|---|---|---|---|
| 3,959,737 | 5/1976 | Tanis | 331/17 X |
| 4,258,333 | 3/1981 | Demuliere et al. | 331/11 |
| 4,388,596 | 6/1983 | Yamashita | 331/17 X |
| 4,510,461 | 4/1985 | Dickes et al. | 331/16 X |

OTHER PUBLICATIONS

Helszajn, J.; "YIG Resonators and Systems", *Electronic Engineering*, Dec. 1983, pp. 47-56.

*Primary Examiner*—Eugene R. LaRoche
*Assistant Examiner*—D. C. Mis
*Attorney, Agent, or Firm*—Steven F. Caserza; Alan H. MacPherson; Kenneth E. Leeds

[57] ABSTRACT

A phase locked loop circuit (16) includes means to eliminate harmonic frequency locking. The phase locked loop includes a voltage controlled oscillator (1) which provides an output signal ($V_{out}$) which is compared with the input signal ($V_{in}$) by a phase detector (4). The output signal from the phase detector is integrated and the output signal of the integrator (7) is placed on the control input lead of the voltage controlled oscillator. The output signal of the voltage controlled oscillator is provided to a frequency detector (14, 17) which determines if the output frequency is within a predefined range. If the output frequency is above the predetermined range, a limiter circuit (15) provides a low voltage output signal to the control input lead of the VCO in order to pull the input voltage of the VCO to a voltage which corresponds with the appropriate operating range of the phase locked loop. If the output frequency of voltage controlled oscillator is below the predefined frequency range, the limiter circuit provides a high voltage output signal to the control input lead of the VCO in order to pull the input voltage of the voltage controlled oscillator to a voltage which corresponds with the proper operating frequency range of the phase locked loop.

21 Claims, 22 Drawing Figures

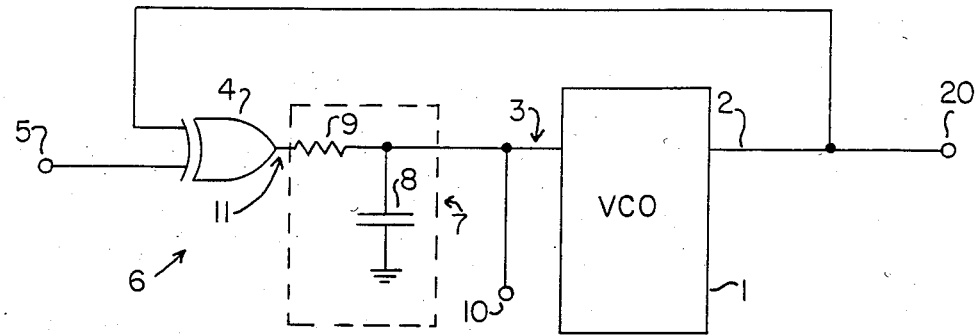
FIG. 1 (Prior Art)
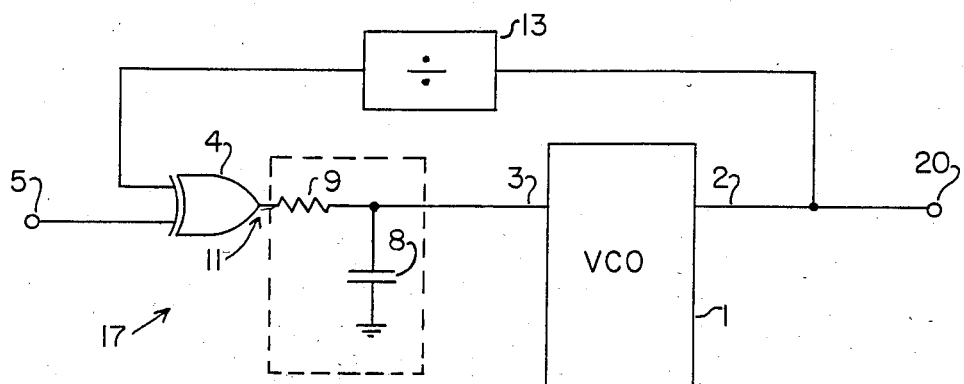
FIG. 2 (Prior Art)
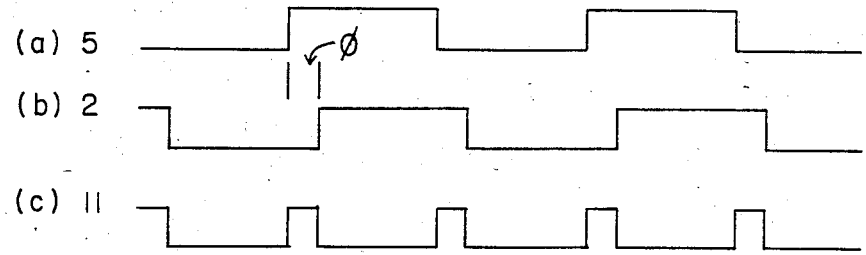
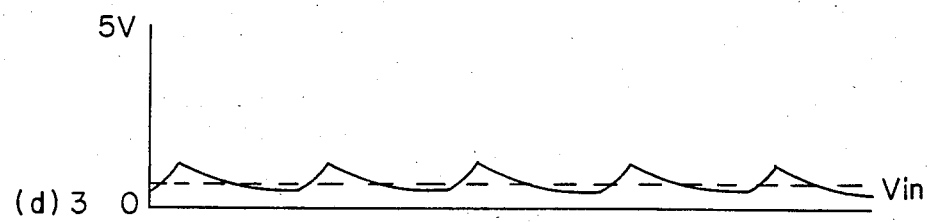
FIG. 3

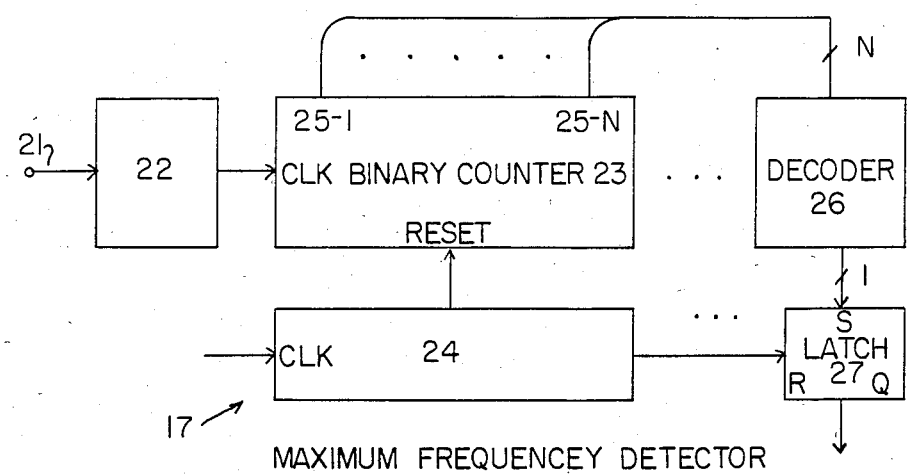
FIG. 8 MAXIMUM FREQUENCEY DETECTOR
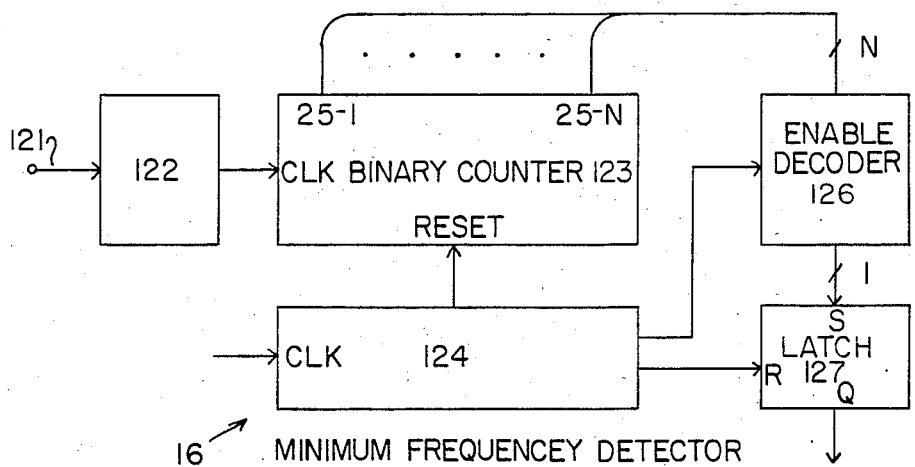
FIG. 9 MINIMUM FREQUENCEY DETECTOR
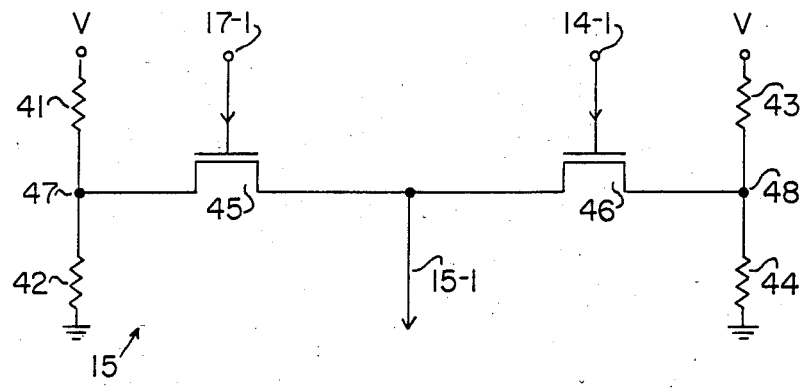
FIG. 10

PHASE LOCKED LOOP WITH HIGH AND/OR LOW FREQUENCY LIMIT DETECTORS FOR PREVENTING FALSE LOCK ON HARMONICS

BACKGROUND OF THE INVENTION

This invention relates to phase locked loops, and more specifically, to phase locked loop circuitry which will not lock when the voltage controlled oscillator (VCO) of the phase locked loop produces a signal which has a frequency that is a harmonic of the frequency of input signal. For purposes of this specification, the term "harmonic" includes harmonics, which are integral multiples of a frequency, and sub-harmonics, which are integral fractions of a frequency.

An example of a prior art phase locked loop is shown in FIG. 1. Phase locked loop 6 is designed to "lock" with the signal $V_{in}$ placed on input terminal 5. Phase locked loop 6 is "locked" when the frequency of the output signal $V_{out}$ on output lead 2 of VCO 1 is equal to the frequency of the input signal on input terminal 5. VCO 1 varies the frequency of the output signal on output lead 2 linearly with the voltage signal applied to input lead 3. Output lead 2 of VCO 1 is connected to one input lead of Exclusive-OR gate 4. The other input lead of Exclusive-OR gate 4 is connected to input terminal 5 for receiving an input signal $V_{in}$. The output lead of Exclusive-OR gate 4 is connected to the input lead of integrator 7. Exclusive-OR gate 4 provides an output signal on its output lead which, when integrated by integrator 7, is proportional to the phase difference between the output signal of VCO 1 and the input signal received on input terminal 5. When phase locked loop 6 is locked, this output signal is nearly a constant voltage. The output lead of integrator 7 is connected to input lead 3 of voltage controlled oscillator 1. Output lead 10 provides to external circuitry (not shown) a voltage signal having a voltage which is proportional to the frequency of the input signal provided on input lead 5. Thus, phase locked loop 6 may be used as a frequency modulation demodulator by applying an F.M. signal to input lead 5, and receiving the demodulated signal on lead 10.

FIG. 2 is a diagram of a phase locked loop 17 which is adapted for use as a frequency multiplier. Frequency divider 13 provides an output signal to Exclusive-OR gate 4 which is the result of dividing the output signal from VCO 1 by a selected integer. Exclusive-OR gate 4 compares the output signal from frequency divider 13 with the input signal applied to input lead 5. Therefore, when phase locked loop 17 is locked with input signal $V_{in}$, the output signal of VCO 1 has a frequency which is an integral multiple of the frequency of input signal $V_{in}$.

FIGS. 3a through 3d depict an example of the voltage versus time graphs for the voltage at terminals 5, 2, 11 and 3 respectively of FIG. 1, when the input signal on input lead 5 has a frequency within the lower one-fourth of the frequency range of VCO 1. For simplicity of discussion, as shown in FIG. 3a, the input signal on input terminal 5 is a squarewave although, regardless of the type of the input signal to Exclusive-OR gate 4, (i.e., squarewave, sinewave, ramp, etc.) the output signals of VCO 1 and Exclusive-OR gate 4 are squarewaves.

In this example, the input signal applied to input lead 3 of VCO 1 has a voltage range of 0 to 5 volts. Of importance, because the frequency of the input signal is low, the phase difference $\phi$ between the input signal on lead 5 and the output signal of VCO 1 on output lead 2 is small (less than 45°). The output signal on output lead 11 of Exclusive-OR gate 4 is shown in FIG. 3c. The output waveform of integrator 7 is shown in FIG. 3d. An ideal integrator produces the time weighted sum of the voltages applied to the integrator. Therefore, if integrator 7 were an ideal integrator, the output signal provided on output lead 3 would be represented by the dotted line shown in FIG. 3d. However, in reality, the output signal of integrator 7 includes components of the input signal to integrator 7. The waveform shown in FIG. 3d has exaggerated swings of amplitude to illustrate the relationship between the waveforms in FIG. 3c and FIG. 3d. In practice, these components of input signal $V_{in}$ on the output signal from integrator 7 are small and thus inconsequential. The output signal of integrator 7 is within the range of approximately 0 to 1.25 volts, thus causing VCO 1 to produce an output signal having the frequency necessary for phase locked loop 6 to lock with the low frequency input signal $V_{in}$.

FIGS. 4a through 4d are time versus voltage diagrams of the voltages on leads 5, 2, 11 and 3 of FIG. 1, respectively, when the frequency of the input signal on input lead 5 is in the upper one-fourth of the frequency range of VCO 1. Of importance, when phase locked loop 1 is locked on a signal having a frequency close to the maximum frequency of VCO 1, the phase difference $\phi$ between the waveforms on leads 5 and 2 is large (greater than approximately 135°). The output signal on output lead 11 of Exclusive-OR gate 4 is shown in FIG. 4c. The output signal of integrator 7 is shown in FIG. 4d. The voltage swings of the waveform shown in FIG. 4d are exaggerated to illustrate the relationship between the waveform in FIG. 4d and the waveform in FIG. 4c. Of importance, the voltage value of the signal in FIG. 4d is within the range of approximately 3.75 to 5 volts, thus causing VCO 1 to provide the high frequency output signal on lead 2 necessary for phase locked loop 6 to lock with the high frequency of the input signal on input lead 5. The relationship between the voltage provided on input lead 3 of VCO 1 and the phase difference $\phi$ between the waveforms on leads 2 and 5 is shown in FIG. 5.

One problem with phase locked loops employing Exclusive-OR gate phase detectors is that these phase locked loops will lock when VCO 1 provides an output signal having a frequency which is a harmonic of the frequency of the input signal on input lead 5. This phenomenon is illustrated in FIGS. 6a thorugh 6g. FIGS. 6a through 6g are the voltage versus time waveforms on leads 2, 5, 11 and 3 of FIG. 1. In this example, two frequencies which may cause VCO 1 to produce the signal provided on lead 2 (shown in FIG. 6a) are shown in FIGS. 6b and 6c. The signal produced by VCO 1 and placed on lead 2 is shown in FIG. 6a. The signal on FIG. 6a has a frequency which is one-half the frequency of the signal in FIG. 6c. In this example the input voltage applied to input lead 3 of VCO 1 necessary to produce a signal of the frequency shown in FIG. 6a is approximately 2.5 volts. The output signal provided on output lead 11 of Exclusive-OR gate 4 when Exclusive-OR gate 4 combines the waveforms in FIGS. 6a and 6b is shown in FIG. 6d. The signal in FIG. 6d is integrated by integrator 7 to provide the waveform in FIG. 6f. The waveform of FIG. 6f provides the voltage to input lead 3 of VCO 1 necessary to produce the signal of FIG. 6a.

The output signal provided on output lead 11 of Exclusive-OR gate 4 when Exclusive-OR gate 4 combines waveforms 6a and 6c is shown in FIG. 6e. The output signal provided by integrator 7 when the waveform in FIG. 6e is the input signal to integrator 7 is shown in FIG. 6g. Of importance, the signal shown in FIG. 6a provides the voltage to input lead 3 of VCO 1 necessary to produce the waveform shown in FIG. 6a, even though the frequency of the signal shown in FIG. 6c is twice the frequency of the signal shown in FIG. 6a. Therefore, phase locked loop 6 properly locks with the input signal shown in FIG. 6b, and yet may improperly lock with the input signal shown in FIG. 6c. The phase locked loop shown in FIG. 1 and the phase locked loop shown in FIG. 2 may incorrectly lock by providing an output signal which is a harmonic of the frequency of input signal $V_{in}$ provided on input lead 5. This harmonic locking problem may be solved by using an edge triggered phase detector as is used in RCA part number CD 4046A. However, phase locked loops using an edge triggered phase detector are very sensitive to noise in that noise spikes in the input signal will "unlock" the phase locked loop. Accordingly, it is desirable to have a phase locked loop which does not use an edge triggered phase detector which will not lock on harmonic frequencies of the input signal to be locked.

SUMMARY

A phase locked loop circuit is disclosed which includes means to eliminate harmonic frequency locking. The phase locked loop includes a voltage controlled oscillator which provides a signal which is compared with the input signal by a phase detector. The output signal of the phase detector is integrated, and the output signal of the integrator is placed on the input lead of the voltage controlled oscillator. The output signal of the voltage controlled oscillator is provided to a frequency detector which determines if the output frequency is within a predefined frequency range or coincides with certain predefined frequencies. If the output frequency is above the predefined frequency range or above the predefined frequencies, a limiter circuit provides a low voltage output signal to the control input lead of the VCO in order to pull the input voltage of the VCO to a voltage which corresponds with the appropriate operating range of the phase locked loop. If the output frequency of voltage controlled oscillator is below the predefined frequency range or below the predefined frequencies, then a limiter circuit provides a high voltage output signal to the control input lead of the VCO in order to pull the input voltage of the voltage controlled oscillator to a voltage which corresponds with the proper operating frequency range of the phase locked loop.

BRIEF DESCRIPTION OF THE DRAWING

FIG. 1 is schematic diagram of a prior art phase locked loop using an Exclusive-OR gate phase detector;

FIG. 2 is a schematic diagram of a phase locked loop using an Exclusive-OR phase detector, which includes a frequency divider so that the phase locked loop provides a frequency which is the multiple of the input frequency to the phase locked loop;

FIGS. 3a through 3d are voltage vs. time diagrams for the input signal, the output signal of the voltage controlled oscillator, the output signal of the Exclusive-OR gate phase detector, and the output signal of the integrator of the structure shown in FIG. 1;

FIG. 8 is a schematic diagram of one embodiment of maximum frequency detector 17 shown in FIG. 7;

FIG. 9 is a schematic diagram of one embodiment of minimum frequency detector 14 shown in FIG. 7;

FIG. 10 is a schematic diagram of one embodiment of limiter circuit 15 shown in FIG. 7.

DETAILED DESCRIPTION

Figure 4:
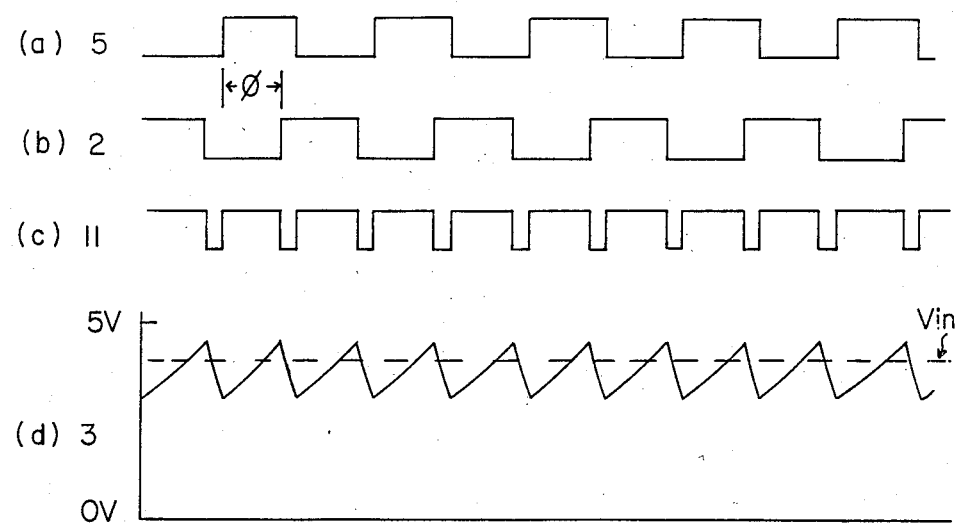
FIGS. 4a through 4d are voltage vs. time diagrams of the input signal, the output signal of the voltage controlled oscillator, the output signal of the Exclusive-OR gate phase detector, and the output signal of the integrator of the structure shown in FIG. 1.
Figure 5:
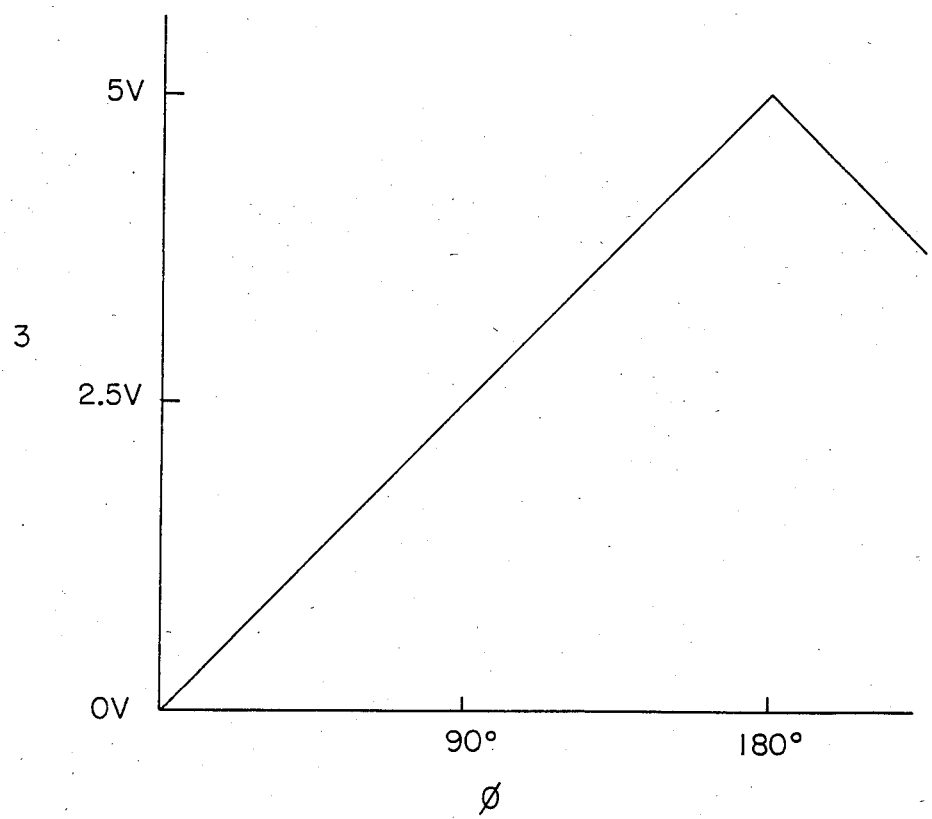
FIG. 5 is a graph of the phase difference between the input signal and the output signal of the voltage controlled oscillator vs. the control input voltage to the voltage controlled oscillator of the structure shown in FIG. 1.
Figure 6:
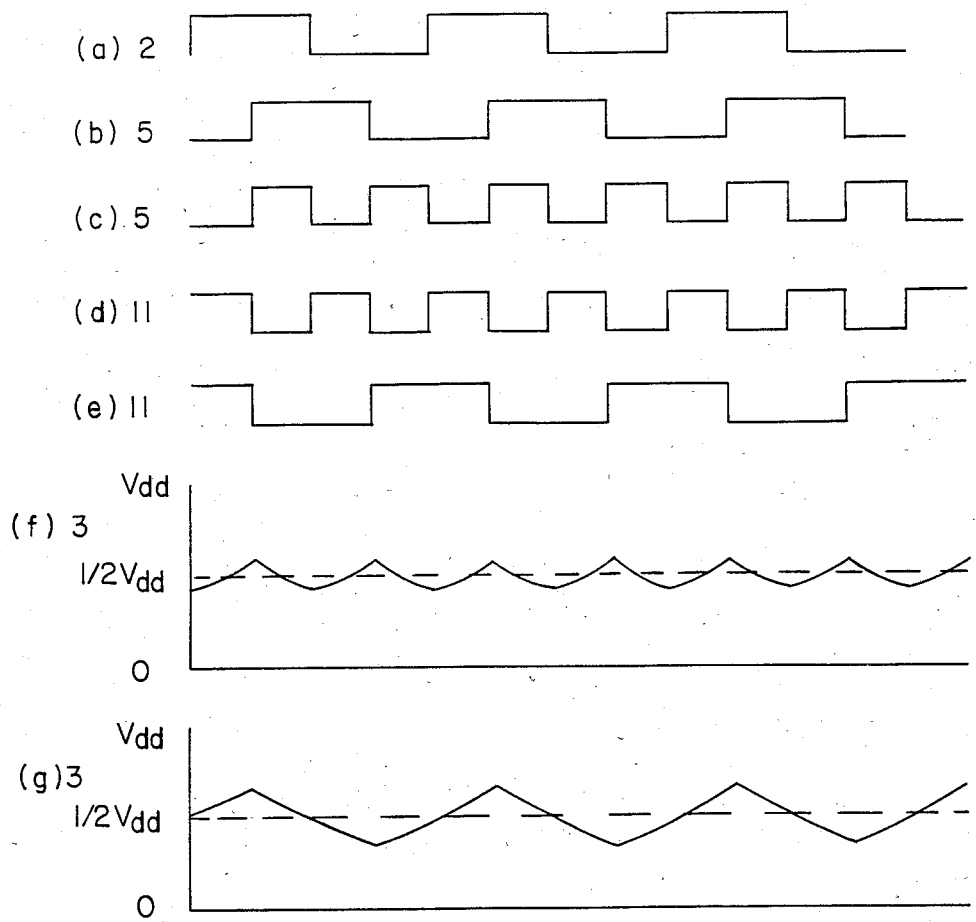
FIGS. 6a through 6g are voltage vs. time diagrams of the input signal, the output signal of the voltage controlled oscillator, the output signal of the Exclusive-OR gate phase detector, and the output signal of the integrator of the structure shown in FIG. 1.
Figure 7:
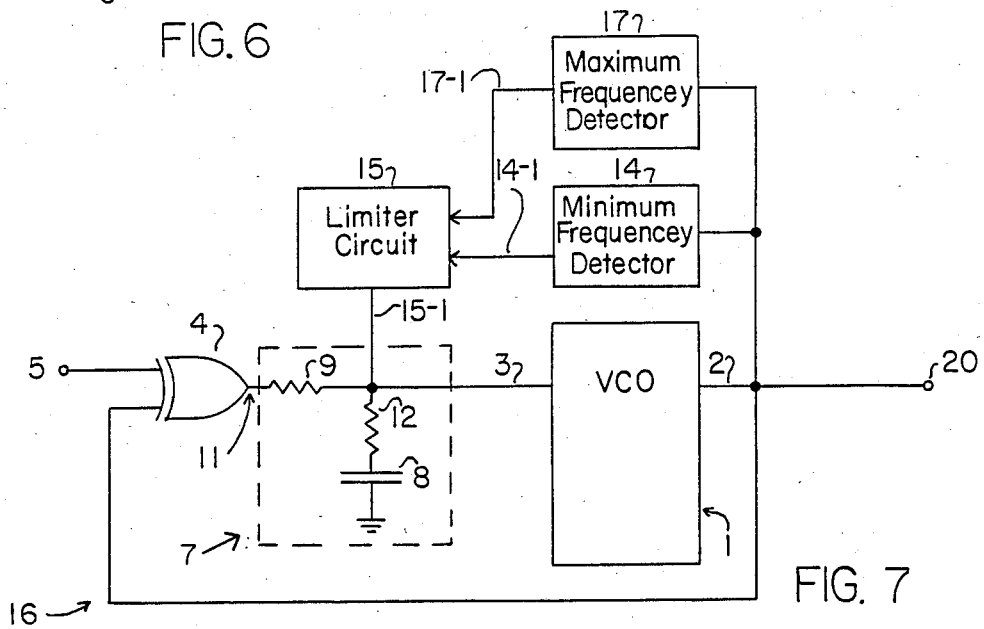
FIG. 7 is a schematic diagram of one embodiment of the present invention which includes means for limiting the phase locked loop to a nonharmonic output frequency operating range.

FIG. 7 is a diagram depicting one embodiment of the present invention. Phase locked loop 16 includes VCO 1, integrator 7, and Exlusive-OR gate phase detector 4, which operate in the same manner as explained for the circuit in FIG. 1. Phase locked loop 16 includes maximum frequency detector 17 minimum frequency detector 14, and limiter circuit 15. Maximum frequency detector 17 and minimum frequency dector 14 receive the output signal on output lead 2 of VCO 1 and determine when the output frequency of VCO 1 is above or below a predefined frequency range. In alternative embodiments of this invention, either minimum frequency detector 14 or maximum frequency detector 17 is omitted, and the resultant structure prevents locking to harmonics or subharmonics, respectively, of the input signal.

One embodiment of maximum frequency detector 17 is shown in FIG. 8. The output signal of VCO 1 (FIG. 7) is applied to input lead 21. Frequency divider 22 divides the frequency of the signal applied to input lead 21 to allow a smaller counter 23 to be used to detect the frequency of the signal applied to input lead 21. Binary counter 23 counts the logical 0 to logical 1 transitions of the output signal of frequency divider 22. Binary counter 23 is well known to those of ordinary skill in the art, and in this embodiment counts up 0. Binary counter 23 is set to 0 by a reset input signal which is periodically provided by frequency divider 24 in order to begin a count cycle. Frequency divide 24 receives a clock signal having a reference frequency with frequency divider 24 divides down to a frequency much less than the frequency of the signal on input lead 21. Alternatively, the reset signal applied to binary counter 23 is provided in any convenient manner. Output signals 25-1 through 25-N from binary counter 23 are applied to decoder 26.

When decoder 26 detects that binary counter 23 has a count value that indicates that the signal on input lead 21 has a frequency equal to or greater than the maximum frequency of the predefined frequency range, decoder 26 provides a logical 1 output signal which causes latch 27 to provide a logical 1 Q output signal. A logical 1 Q output signal provided by latch 27 indicates that the frequency of the signal applied to input lead 21 is greater than the maximum frequency of the predefined frequency range. Latch 27 provides a logical 1 Q output signal until a reset signal is applied to latch 27 by frequency divider 24, at which time the Q output signal of latch 27 is reset to a logical 0. Frequency divider 24 provides a reset signal to latch 27 at least one every count cycle. Therefore, frequency detector 17 determines whether the frequency of a signal applied to input lead 21 is above a selected frequency by counting the number of cycles of the input frequency between reset pulses applied by frequency divider 24, to latch 27 and binary counter 23.

In this embodiment, binary counter 23 is designed to count up from 0. In other embodiments, binary counter 23 may count up or down from any predetermined number. For example, binary counter 23 may be designed to count down to 0 from an initial count value defining the maximum frequency to be detected. The initial count value is loaded into binary counter 23 periodically in response to a reset signal provided by frequency divider 24. When decoder 26 detects that binary counter 23 has counted down to 0, decoder 26 provides a logical 1 output signal which causes latch 27 to provide a logical 1 Q output signal, indicating that the input signal applied to input lead 21 has a frequency which exceeds the maximum frequency defined by the initial count value of binary counter 23.

One embodiment of minimum frequency detector 14 is shown in FIG. 9. Frequency divider 122, frequency divider 124 and latch 127 operate in the same manner as frequency divider 22, frequency divider 24, and latch 27, respectively, of maximum frequency detector 17 (FIG. 8). Binary counter 123 is preset to an initial count value defining the minimum frequency to be detected. The initial count value is loaded into binary counter 123 periodically in response to a reset signal provided by frequency divider 124, or any other suitable means for providing a reset signal. Binary counter 123 then counts down until it reaches a zero count value, at which count binary counter 123 stops counting. After a time period determined by the frequency of the clock signal applied to frequency divider 124, frequency divider 124 applies an enable signal to decoder 126. If the count value of binary counter 123 is not equal to 0, decoder 131 provides a logical 1 output signal to latch 127, causing latch 127 to provide a logical 1 Q output signal, indicating that the frequency of the input signal received on input lead 121 is less than the minimum frequency of the predefined operating range of circuit 16 (FIG. 7.). Frequency divider 124 then disables decoder 126. Frequency divider 124 then applies a reset signal to binary counter 123 and latch 127. In this embodiment, the reset signal to latch 127 is applied simultaneously with the reset signal applied to binary counter 123. In other embodiments the reset signal applied to latch 127 may be applied at a different time than the reset signal applied to binary counter 123. However, the reset signal for latch 127 must be applied before the enable signal is applied to decoder 126 in order for the Q output signal of latch 127 to properly reflect the frequency of the signal applied to input lead 21.

In this embodiment, binary counter 123 is designed to count down from an initial value. In other embodiments, binary counter 123 may count up or down from any predetermined number. For example, binary counter 123 may be designed to count up from 0 to a value defining the detected frequency. Binary counter 123 is periodically reset in response to a reset signal provided by the frequency divider 124. When decoder 126 detects that binary counter 123 has not counted up to a value defining the minimum frequency, decoder 126 provides a logical 1 output signal which causes latch 127 to provide a logical 1 Q output signal, indicating that the input signal applied to input lead 21 has a frequency which is less than the minimum frequency of the predetermined operating range of circuit 16 (FIG. 7).

Referring to FIG. 7, when maximum frequency detector 17 detects an output signal from VCO 1 which has a frequency greater than the predefined operating range of phase locked loop 16, maximum frequency detector 17 provides a logical 1 signal on lead 17-1 which causes limiter circuit 15 to provide a low voltage sufficient to pull the voltage level of input lead 3 of VCO 1 to a voltage level which corresponds with a VCO output frequency within the predefined operating range of phase locked loop 16. In this manner, limiter circuit 17 insures that the frequency of the output signal of VCO 1 is sufficiently close to the frequency of the input signal on input lead 5 to allow phase locked loop 16 to lock on to the desired input frequency rather than a harmonic of the desired frequency. Similarly, if minimum frequency detector 14 detects that the output signal from VCO 1 has frequency below the predefined operating range of phase locked loop 16, minimum frequency detector 14 provides a logical 1 signal on lead 14-1 which causes limiter circuit 15 to provide a high voltage sufficient to pull the voltage level of input lead 3 of VCO 1 to a voltage which corresponds with a VCO output frequency within the predefined operating range of phase locked loop 16.

FIG. 10 is a schematic diagram of one embodiment of limiter circuit 15. Resistors 41 and 42 form a voltage divider which provides a selected voltage level on node 47. Similarly, 43 and 44 form a voltage divider which provides a selected voltage level on node 48. When a logical 1 signal is provided on lead 17-1, indicating a frequency above the predefined operating range of phase locked loop 16, N-channel field effect transistor 45 is turned on, thereby placing a voltage level equal to that of node 47 on lead 15-1, thereby forcing VCO 1 (FIG. 7) to provide an output signal having a frequency within the predefined operating range of phase locked loop 16. When a logical 1 signal is provided on lead 14-1, indicating a frequency below the predefined operating range of phase locked loop 16, N-channel field effect transistor 46 is turned on, thereby placing a voltage level equal to that of node 48 on lead 15-1, thereby forcing VCO 1 (FIG. 7) to provide an output signal having a frequency within the predefined operating range of phase locked loop 16.

To avoid the problem of harmonic locking in phase locked loops using Exclusive-OR gate phase detectors, the predefined operating range which is measured by frequency detectors 14 and 17 is preferably chosen such that the lowest frequency in the predefined operating range is greater than one-half of the highest frequency in the predetermined operating range. Therefore, no frequency within the predetermined operating range is a harmonic frequency of another frequency within the predetermined operating range.

When phase locked loop 16 (FIG. 7) is designed to lock with predefined frequencies, rather than any frequency within a predefined range of frequencies, maximum frequency detector 17 and minimum frequency detector 14 receive the output signal on output lead 2 of VCO 1 and determine when the output frequency of VCO 1 is above or below all of the predefined frequencies. For example, for an AT&T standard 103 type modem under certain conditions, the phase locked loop should lock to either 2025 hertz or 2225 hertz. Thus, 1800 hertz may be chosen to be the lower limit detected by minimum frequency detector 14 and 2400 hertz the upper limit detected by maximum frequency detectors 17.

When maximum frequency detector 17 detects an output signal of VCO 1 which has a frequency greater than all of the predefined frequencies of phase locked loop 16 it provides a signal on lead 14-1 which causes limiter circuit 15 to provide a low voltage sufficient to pull the voltage level of input lead 3 of VCO 1 to a voltage level which corresponds with a VCO output frequency in close proximity to the predefined frequencies. Limiter circuit 15 insures that the frequency of the output signal of VCO 1 is sufficiently close to the frequency of input signal $V_{in}$ to allow phase locked loop 16 to lock on to the desired input frequency rather than a harmonic of the predefined frequency. Similarly, if minimum frequency detector 14 detects that the output signal from VCO 1 has frequency below all of the predefined frequenices, limiter circuit 15 provides an output voltage which pulls the voltage level of input lead 3 of VCO 1 to a voltage which corresponds with a frequency in close proximity to the predefined frequencies.

To avoid the problem of harmonic locking in phase locked loops using Exclusive-OR gate phase detectors, the predefined operating range which is measured by frequency detectors 14 and 17 are preferably chosen such that the lowest frequency of the predefined frequencies is greater than one-half of the highest frequency of the predefined frequencies. Therefore, no frequency of the predefined frequencies is a harmonic frequency of another frequency of the predefined frequencies.

Figure 11:
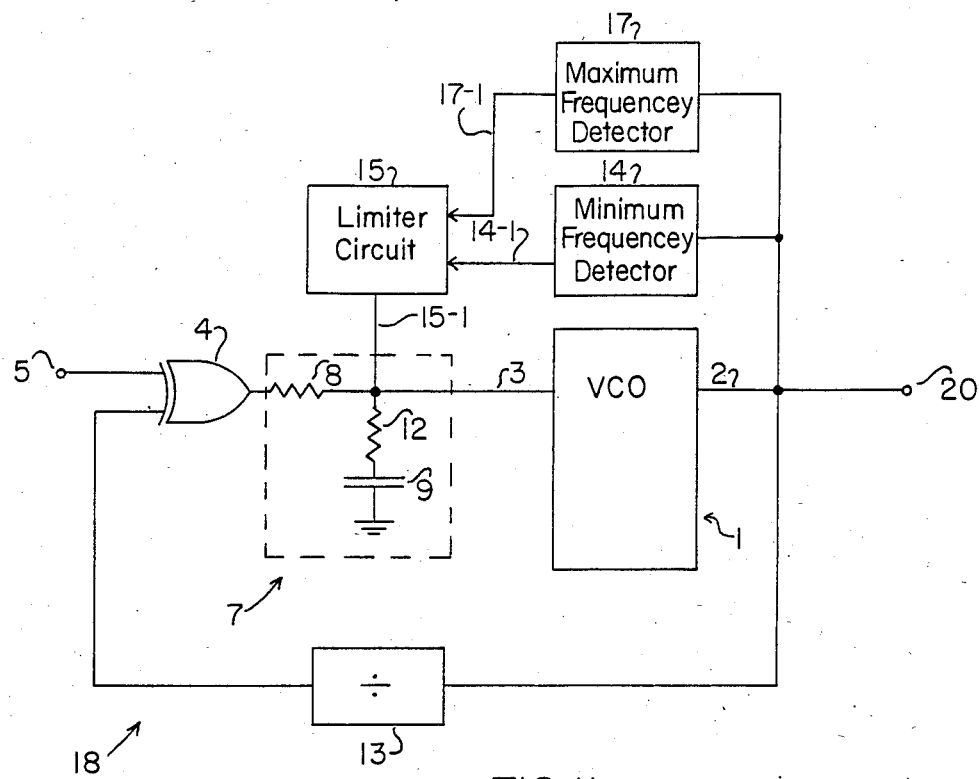
FIG. 11 is a schematic diagram of one embodiment of the present invention which includes means for limiting the phase locked loop to nonharmonic frequency operation, and a frequency divider so that the output signal of the voltage controlled oscillator is a frequency that is a multiple of the frequency of the input signal provided to the phase locked loop.

FIG. 11 is a diagram of a phase locked loop constructed in accordance with the present invention. Phase locked loop 18 uses a frequency divider to provide an output signal having a frequency which is an integral multiple of the frequency of the input signal.

While this specification illustrates specific embodiments of this invention, it is not to be interpreted as limiting the scope of the invention. Many embodiments of this invention will become evident to those of ordinary skill in the art in light of the teachings of this specification.

We claim:

1. A phase locked loop circuit having an input terminal for receiving an input signal and an output terminal for providing a signal in response to said input signal, comprising:

phase detection means having a first input lead, a second input lead connected to said input terminal, and having an output lead;

integrator means having an input lead connected to said output lead of said phase detection means, and having an output lead;

a voltage controlled oscillator having a control voltage input lead connected to said output lead of said integrator means and an output lead connected to said first input lead of said phase detection means and to said output terminal; and frequency detection means for detecting when an input signal has a frequency less than or greater than a predetermined frequency range, having an input lead connected to said output lead of said voltage controlled oscillator and an output lead connected to said control voltage input lead, wherein said frequency detection means provides a signal to said voltage controlled oscillator to raise the frequency of the output signal of said voltage controlled oscillator when said frequency detection means detects that said input signal has a frequency less than said predetermined frequency range, and wherein said frequency detection means provides a signal to said voltage controlled oscillator to lower the frequency of said output signal of said voltage controlled oscillator when said frequency detection means detects that said input signal has a frequency greater than said predetermined frequency range.

2. A phase locked loop circuit as in claim 1 wherein said phase detection means comprises an Exclusive-OR gate.

3. A phase locked loop circuit as in claim 1 wherein said integrator means comprises:

a first resistor having a first lead serving as said input lead of said integrator means, and a second lead;

a second resistor having a first lead connected to said second lead of said first resistor and serving as said output lead of said integrator means, and a second lead; and a capacitor having a first lead connected to said second lead of said second resistor and a second lead connected to a reference potential.

4. A phase locked loop circuit as in claim 1 wherein said output terminal is connected to said control voltage input lead.

5. A phase locked loop circuit as in claim 1 wherein said output terminal is connected to said output lead of said voltage controlled oscillator.

6. A phase locked loop circuit as in claim 1 wherein said frequency detection means comprises a limiter circuit having an output lead serving as said output lead of said frequency detection means, said limiter circuit providing on said output lead a first potential when said frequency detection means detects that said input signal has a frequency less than said predetermined frequency range, and providing on said output lead a second potential when said frequency detection means detects that said input signal has a frequency greater than said predetermined frequency range, said limiter circuit comprising:

a first switch means having a first current handling terminal connected to said first potential, and having a second current handling terminal connected to said output lead, wherein said first switch means is closed when said frequency detection means detects that said input signal has a frequency less than said predetermined frequency range thereby providing said first potential on said output lead; and a second switch means having a first current handling terminal connected to said second potential, and having a second current handling terminal connected to said output lead, wherein said second switch means is closed when said frequency detection means detects that said input signal has a frequency greater than said predetermined frequency range thereby providing said second potential on said output lead.

7. A phase locked loop circuit as in claim 1 wherein said output lead of said voltage controlled oscillator is connected to said first input lead of said phase detection means via a frequency divider wherein said frequency divider provides a signal on said first lead of said phase detection means with a frequency which is equal to the frequency of the signal provided on said output lead of said voltage controlled oscillator divided by a selected positive integer.

8. A phase locked loop circuit having an inut terminal for receiving an input signal and an output terminal for providing a signal in response to said input signal, comprising:
  phase detection means having a first input lead, a second input lead connected to said input terminal, and having an output lead;
  integrator means having an input lead connected to said output lead of said phase detection means, and having an output lead;
  a voltage controlled oscillator having a control voltage input lead connected to said output lead of said integrator means and an output lead connected to said first input lead of said phase detection means;
  frequency detection means for detecting when an input signal has a frequency greater than a predetermined frequency, having an input lead connected to said output lead of said voltage controlled oscillator and an output lead connected to said control voltage input lead, wherein said frequency detection means provides a signal to said voltage controlled oscillator to lower the frequency of said output signal of said voltage controlled oscillator when said frequency detection means detects that said input signal has a frequency greater than said predetermined frequency.

9. A phase locked loop circuit as in claim 8 wherein said phase detection means comprises an Exclusive-OR gate.

10. A phase locked loop circuit as in claim 8 wherein said integrator means comprises:
  a first resistor having a first lead serving as said input lead of said integrator means, and a second lead;
  a second resistor having a first lead connected to said second lead of said first resistor and serving as said output lead of said integrator means, and a second lead; and
  a capacitor having a first lead connected to said second lead of said second resistor and a second lead connected to a reference potential.

11. A phase locked loop circuit as in claim 8 wherein said output terminal is connected to said control voltage input lead.

12. A phase locked loop circuit as in claim 8 wherein said output terminal is connected to said output lead of said voltage controlled oscillator.

13. A phase locked loop circuit as in claim 8 wherein said frequency detection means comprises a limiter circuit having an output lead serving as said output lead of said frequency detection means, said limiter circuit providing on said output lead a selected potential when said frequency detection means detects a frequency greater than said predetermined frequency range, said limiter circuit comprising:
  switch means having a first current handling terminal connected to said selected potential, and having a second current handling terminal connected to said output lead, wherein said switch means is closed when said frequency detection means detects that said input signal has a frequency greater than said predetermined frequency range thereby providing said selected potential on said output lead.

14. A phase locked loop circuit as in claim 8 wherein said output lead of said voltage controlled oscillator is connected to said first input lead of said phase detection means via a frequency divider wherein said frequency divider provides a signal on said first lead of said phase detection means with a frequency which is equal to the frequency of the signal provided on said output lead of said voltage controlled oscillator divided by a selected positive integer.

15. A phase locked loop circuit having an input terminal for receiving an input signal and an output terminal for providing a signal in response to said input signal, comprising:
  phase detection means having a first input lead, a second input lead connected to said input terminal, and having an output lead;
  integrator means having an input lead connected to said output lead of said phase detection means, and having an output lead;
  a voltage controlled oscillator having a control voltage input lead connected to said output lead of said integrator means and an output lead connected to said first input lead of said phase detection means;
  frequency detection means for detecting when an input signal has a frequency less than a predetermined frequency, having an input lead connected to said output lead of said voltage controlled oscillator and an output lead connected to said control voltage input lead, wherein said frequency detection means provides a signal to said voltage controlled oscillator to raise the frequency of the output signal of said voltage controlled oscillator when said frequency detection means detects that said input signal has a frequency less than said predetermined frequency.

16. A phase locked loop circuit as in claim 15 wherein said phase detection means comprises an Exclusive-OR gate.

17. A phase locked loop circuit as in claim 15 wherein said integrator means comprises:
  a first resistor having a first lead serving as said input lead of said integrator means, and a second lead;
  a second resistor having a first lead connected to said second lead of said first resistor and serving as said output lead of said integrator means, and a second lead; and
  a capacitor having a first lead connected to said second lead of said second resistor and a second lead connected to a reference potential.

18. A phase locked loop circuit as in claim 15 wherein said output terminal is connected to said control voltage input lead.

19. A phase locked loop circuit as in claim 15 wherein said output terminal is connected to said output lead of said voltage controlled oscillator.

20. A phase locked loop circuit as in claim 15 wherein said frequency detection means comprises a limiter circuit having an output lead serving as said output lead of said frequency detection means, said limiter circuit providing on said output lead a selected potential when said frequency detection means detect that said input signal has a frequency less than said predetermined frequency, said limiter circuit comprising:

switch means having a first current handling terminal connected to said selected potential, and having a second current handling terminal connected to said output lead, wherein said switch means is closed when said frequency detection means detects that said input signal has a frequency less than said predetermined frequency, thereby providing said selected potential on said output lead.

21. A phase locked loop circuit as in claim 15 wherein said output lead of said voltage controlled oscillator is connected to said first input lead of said phase detection means via a frequency divider wherein said frequency divider provides a signal on said first lead of said phase detection means with a frequency which is equal to the frequency of the signal provided on said output lead of said voltage controlled oscillator divided by a selected positive integer.

* * * * *